(12) United States Patent
Yamamoto (10) Patent No.: US 10,585,117 B2
(45) Date of Patent: Mar. 10, 2020

(54) CONTACT PROBE AND INSPECTION JIG

(71) Applicant: YOKOWO CO., LTD., Kita-ku, Tokyo (JP)

(72) Inventor: Tsugio Yamamoto, Tomioka (JP)

(73) Assignee: YOKOWO CO., LTD., Kita-ku, Tokyo (JP)

( * ) Notice: Subject to any disclaimer, the term of this patent is extended or adjusted under 35 U.S.C. 154(b) by 0 days.

(21) Appl. No.: 16/011,922

(22) Filed: Jun. 19, 2018

(65) Prior Publication Data

US 2019/0004090 A1    Jan. 3, 2019

(30) Foreign Application Priority Data

Jun. 28, 2017  (JP) ................................. 2017-126512

(51) Int. Cl.
| | | |
|---|---|---|
| *G01R 1/04* | (2006.01) | |
| *G01R 1/067* | (2006.01) | |
| *G01R 31/02* | (2006.01) | |
| *H01R 12/00* | (2006.01) | |
| *H01R 4/48* | (2006.01) | |
| *G01R 31/28* | (2006.01) | |

(52) U.S. Cl.
CPC ....... *G01R 1/06722* (2013.01); *G01R 1/0466* (2013.01); *G01R 1/06705* (2013.01); *G01R 1/06733* (2013.01); *G01R 31/2886* (2013.01)

(58) Field of Classification Search
CPC .......... G01R 1/04; G01R 1/067; G01R 1/073; G01R 31/02; G01R 31/28; H01R 12/00; H01R 4/48
See application file for complete search history.

(56) References Cited

U.S. PATENT DOCUMENTS

| | | | | |
|---|---|---|---|---|
| 7,463,041 B2* | 12/2008 | Kazama | ............. | G01R 1/06722 324/755.05 |
| 2009/0219042 A1* | 9/2009 | Sasaki | ................ | G01R 1/07314 324/756.03 |
| 2010/0271061 A1* | 10/2010 | Yamamoto | .......... | G01R 1/06722 324/754.03 |
| 2014/0253163 A1* | 9/2014 | Suzuki | ............... | G01R 1/06722 324/755.05 |
| 2015/0168455 A1* | 6/2015 | Anraku | ..................... | C22C 5/04 324/754.03 |

FOREIGN PATENT DOCUMENTS

JP    2010-151732 A    7/2010

* cited by examiner

*Primary Examiner* — Neel D Shah (74) *Attorney, Agent, or Firm* — Morgan, Lewis & Bockius LLP (57) ABSTRACT

A contact probe includes a first plunger, a second plunger, and a coil spring. The coil spring is disposed outside the first plunger, and urges the first plunger and the second plunger in a direction away from each other. The first plunger and the second plunger are fitted to each other so as to be slidable with respect to each other. The first plunger includes a large diameter part, and a small diameter part provided on a proximal end side of the large diameter part. The small diameter part is fitted into the second plunger. The coil spring includes a close winding part on a side of the second plunger. Adjacent lines of the close winding parts are brought into close contact with each other and come into electrical contact with each other at least in a compressed state of the coil spring.

5 Claims, 6 Drawing Sheets

CONTACT PROBE AND INSPECTION JIG

CROSS-REFERENCES TO RELATED APPLICATIONS

This patent application is based on and claims priority from Japanese Patent Application No. 2017-126512 filed on Jun. 28, 2017, the entire contents of which are incorporated herein by reference.

BACKGROUND

1. Field of the Invention

The present invention relates to a contact probe for inspecting an inspection object such as a semiconductor integrated circuit, and an inspection jig including the contact probe. The present invention particularly relates to a contact probe and an inspection jig capable of allowing a large current to pass therethrough.

2. Description of Related Art

There are an inner spring type contact probe in which a plunger is provided at both end portions of a tube and a coil spring is disposed in the tube, and an outer spring type contact probe in which a coil spring is disposed outside a plunger which is slidably fitted to each other.

The outer spring type contact probe is advantageous for increasing a wire diameter of the coil spring. In general, the outer spring type contact probe is adopted for high current applications.

An outer spring type contact probe and an inspection jig including the contact probe according to related art will be described referring to FIGS. 8A to 10. An inspection jig 1B includes a contact probe 10B and a socket 5 made of an insulating resin that holds the contact probe 10B while the contact probe 10B penetrates through the socket 5. Although the number of contact probe 10B supported by the socket 5 is one in the illustrated example, it may be plural. In the socket 5, a first insulating support 6, a second insulating support 7, and a third insulating support 8 are combined and integrated with each other by screwing or the like. A small diameter hole portion 6a and a large diameter hole portion 6b of the first insulating support 6 and hole portions 7a and 8a of the second and third insulating supports 7 and 8 configure a through hole for holding the contact probe 10B. The inner diameters of the hole portions 7a and 8a are the same as the inner diameter of the large diameter hole portion 6b.

The contact probe 10B includes a first plunger 20 and a second plunger 30 which are slidably fitted to each other in a state of being in contact with each other, and a coil spring 60 which is disposed outside the first plunger 20 and urges the first plunger 20 and the second plunger 30 in a direction of separating from each other. The first plunger 20 is a connecting part with the inspection object 70 illustrated in FIGS. 8B and 8C. The second plunger 30 is a connecting part with the inspection substrate 80 illustrated in FIGS. 8B and 8C. Both the first plunger 20 and the second plunger 30 are made of an electrically conductive metal body such as copper or a copper alloy. The coil spring 60 is formed of a general electrically conductive metal material such as a piano wire or a stainless steel wire. The coil spring 60 urges the first plunger 20 and the second plunger 30 in a direction away from each other to apply a contact force between the first plunger 20 and the second plunger 30 with respect to the inspection object 70 and the inspection substrate 80. The inspection object 70 is, for example, a semiconductor integrated circuit in which electrodes are arranged at predetermined intervals. In the case of the inspection object 70, in the drawing, the electrode pads 71 are arranged at predetermined intervals. The inspection substrate 80 includes an electrode pad 81 connected to a measuring instrument side (not illustrated) at predetermined intervals.

Figures 8A, 8B:
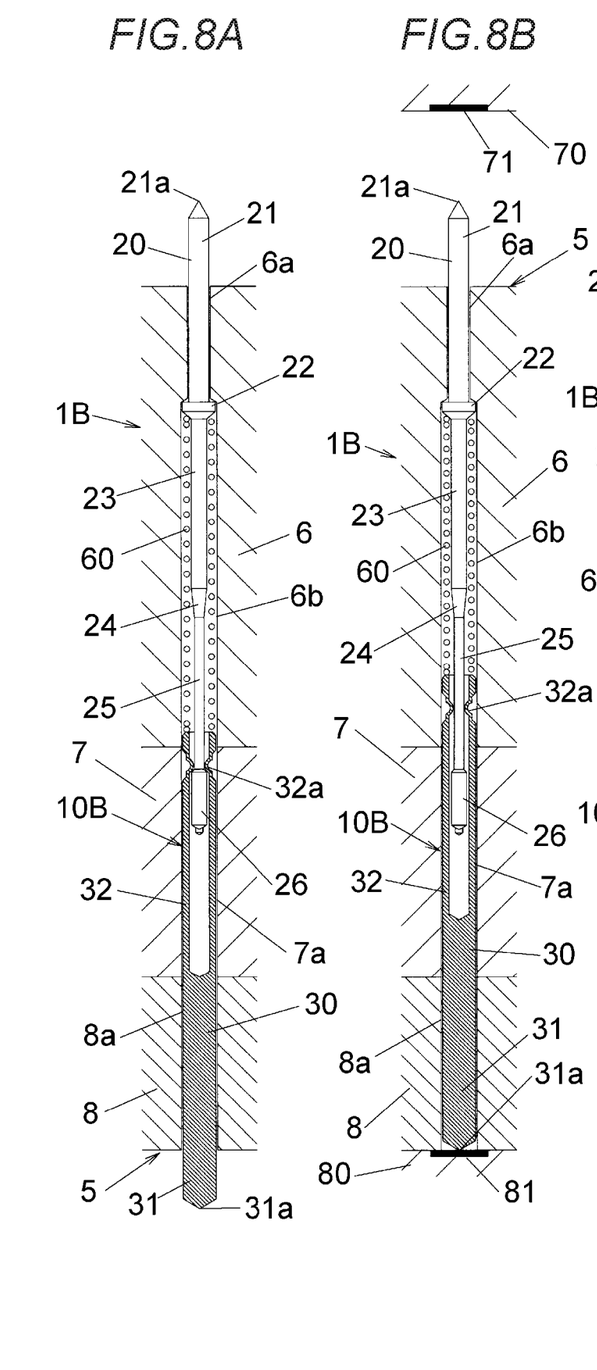
FIG. 8A is a side cross-sectional view illustrating an initial state of the contact probe and the inspection jig of related art.
FIG. 8B is a side cross-sectional view illustrating a set state of the contact probe and the inspection jig (a state in which the inspection jig is mounted on the inspection substrate) of the related art.

The first plunger 20 includes a distal-end-side cylindrical portion 21 as a distal end side rod portion, a flange portion 22 as a large diameter part for preventing removal, a large diameter part 23, a tapered portion 24, a small diameter part 25, and a proximal-end-side cylindrical portion 26 having a larger diameter than the small diameter part 25, sequentially from a distal end side (a side toward the inspection object 70 is the distal end side). The distal-end-side cylindrical portion 21 passes through the small diameter hole portion 6a of the first insulating support member 6 and projects from the surface of the first insulating support member 6. The distal-end-side cylindrical portion 21 includes a contact portion 21a which is tapered (conical) in a tapered shape at the distal end. The flange portion 22 is formed to have a larger diameter than the distal-end-side cylindrical portion 21. The flange portion 22 is accommodated inside the large diameter hole portion 6b of the first insulating support member 6. The outer diameter of the flange portion 22 is larger than the inner diameter of the small diameter hole portion 6a. Therefore, the flange portion 22 engages with a stepped surface which is a boundary between the small diameter hole portion 6a and the large diameter hole portion 6b, thereby preventing the first plunger 20 from being extracted from the first insulating support 6. In the flange portion 22, a cross-section perpendicular to the longitudinal direction of the first plunger 20 is circular. The outer diameter of the flange portion 22 is slightly smaller than the inner diameter of the large diameter hole portion 6b. A large diameter part 23, a tapered portion 24, a small diameter part 25 and a proximal-end-side cylindrical portion 26 are formed on the proximal-end-side of the flange portion 22 toward the second plunger 30. The proximal-end-side cylindrical portion 26 is always fitted into the inside of the tubular portion (bottomed cylindrical portion) 32 of the second plunger 30 in slidable manner. As illustrated in FIG. 8A, in the non-compressed state of the coil spring 60, only a part of the small diameter part 25 is fitted to the inside of the tubular portion 32. In the compressed state of the coil spring 60 in FIG. 8C, most of the small diameter part 25 is fitted to the inside of the tubular portion 32.

The second plunger 30 includes a distal-end-side cylindrical portion 31 and a proximal-end-side tubular portion 32 in order from the distal end side when the direction toward the inspection substrate 80 is set as the distal end side. The second plunger 30 is slidably movable in the large diameter hole portion 6b of the first insulating support 6 and the hole portions 7a and 8a of the second and third insulating supports 7 and 8. The second plunger 30 penetrates the holes 7a and 8a and protrudes from the surface of the third insulating support 8. The distal end of the distal-end-side cylindrical portion 31 serves as a contact portion 31a tapered (conical) in a tapered shape. In a state in which the proximal-end-side cylindrical portion 26 of the first plunger 20 is fitted into the tubular portion 32, a small diameter pail 32a is formed by drawing at the proximal end side of the tubular portion 32. The proximal-end-side cylindrical portion 26 of the first plunger 20 sliding inside the tubular portion 32 is larger in diameter than the inner diameter of the small diameter part 32a of the tubular onion 32. Therefore, by engaging the proximal-end-side cylindrical portion 26 with the small diameter part 32a, it is possible to prevent the first plunger 20 from being extracted from the tubular portion 32. The second plunger 30 is not extracted from the first plunger 20.

The coil spring 60 is disposed outside the first plunger 20 and inside the large diameter hole portion 6b of the first insulating support member 6 between the flange portion 22 of the first plunger 20 and the proximal-end-side end face of the second plunger 30 (the proximal-end-side end surface of the tubular portion 32). The coil spring 60 is roughly wound with a gap between the lines as a whole.

In the initial state of FIG. 8A, both the first plunger 20 and the second plunger 30 protrude from the socket 5. When the socket 5 is placed on the inspection substrate 80 as in the set state of FIG. 8B, the contact portion 31a of the distal end of the second plunger 30 comes into contact with the electrode pad 81 of the inspection substrate 80. From this state, when the electrode pad 71 of the inspection object 70 is pressed against the contact portion 21a at the distal end of the first plunger 20 as in the inspection state of FIG. 8C, the coil spring 60 is compressed. As a result, the contact probe 10B comes into contact with the electrode pad 71 of the inspection object 70 and the electrode pad 81 of the inspection substrate 80 with a sufficient contact pressure. As a result, the electrode pad 71 and the electrode pad 81 are electrically connected to each other, and an electric current can flow between the electrode pad 71 and the electrode pad 81.

Figure 8C:
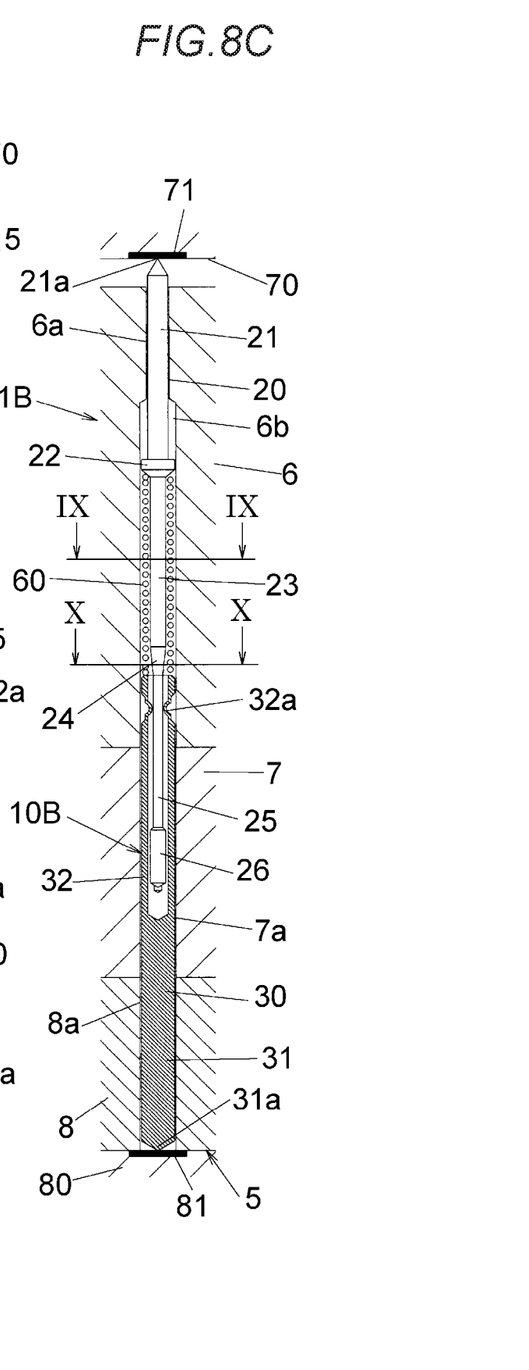
FIG. 8C is a side cross-sectional view illustrating a test state of the contact probe and the inspection jig of the related art.
Figure 9:
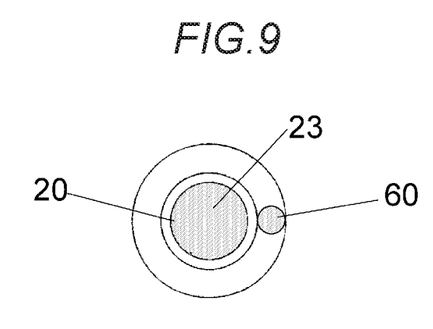
FIG. 9 is an explanatory view illustrating a current path at a position of a cross-section taken along the line IX-IX in FIG. 8C.
Figure 10:
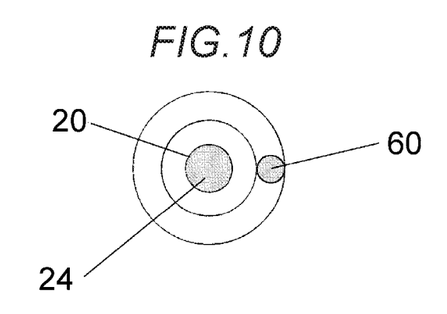
FIG. 10 is an explanatory view illustrating a current path at a position of a cross-section taken along the line X-X of FIG. 8C.

In the contact probe 10B of the related art, there is a portion in which the cross-sectional area of the current path decreases in the inspection state of FIG. 8C. That is, in FIG. 9 which is an explanatory view illustrating a current path in the IX-IX cross-section of FIG. 8C, the sum of the cross-sectional area of the large diameter part 23 of the first plunger 20 and the wire rod cross-sectional area of the coil spring 60 can contribute to the electric conduction. On the other hand, in FIG. 10, which is an explanatory view illustrating a current path in the X-X cross-section in FIG. 8C, although the wire cross-sectional area of the coil spring 60 does not change, a cross-sectional area of the tapered portion 24 which is close to the small diameter part 25 of the first plunger 20 becomes considerably smaller than a cross-sectional area of the large diameter part 23. Therefore, the maximum current value that can be applied to the contact probe 10B is restricted by the cross-sectional area of the current path of FIG. 10. Particularly in the vicinity of the cross-section of FIG. 10, heat generation of the coil spring 60 is increased, and an event that the coil spring 60 melts occurs.

Figures 3, 4:
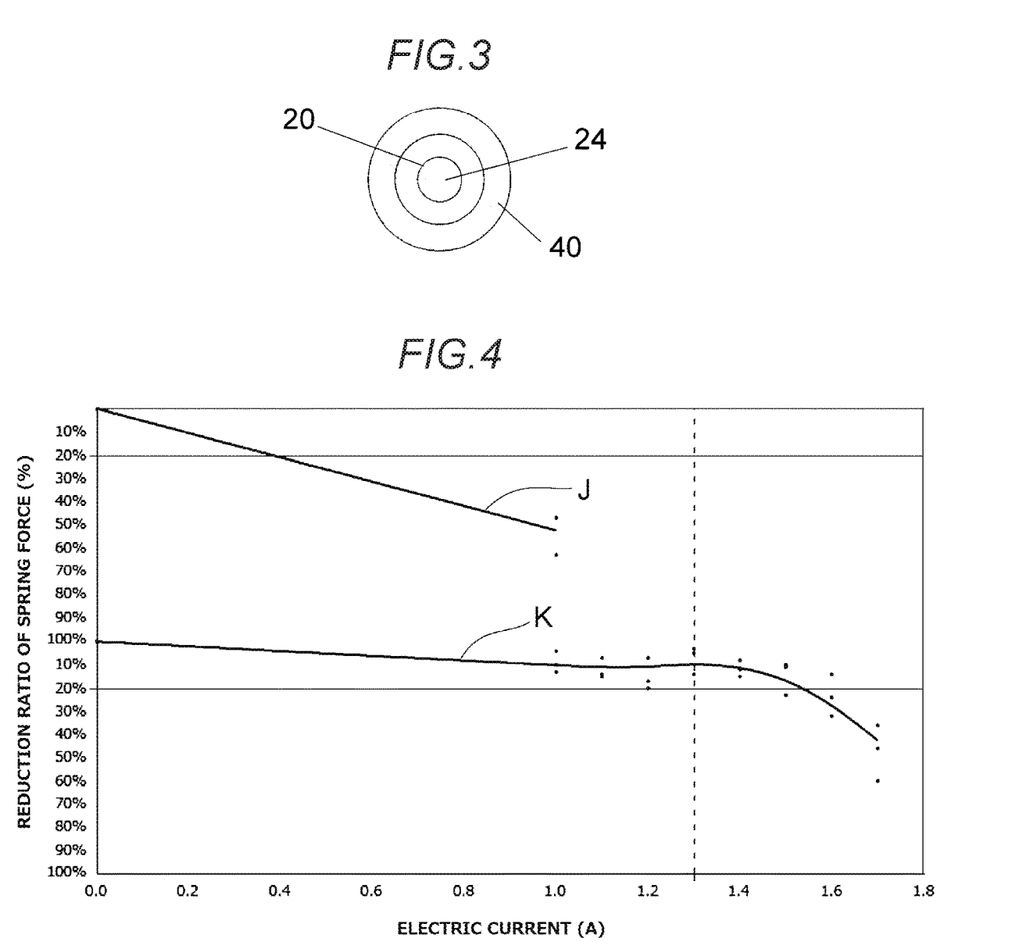
FIG. 3 is an explanatory view illustrating a current path at a position of a cross-section taken along line III-III of FIG. 1C.
FIG. 4 is a graph illustrating a relationship between an energizing current [A] of the contact probe and a reduction rate [%] of the spring force according to the first embodiment and the related art.

A solid line J in FIG. 4 illustrates a relationship between the energizing current [A] of the contact probe 10B according to the related art and the reduction rate [%] of the spring force. At 0.4 A, the spring force drops by 20%, and at 1A, the spring force drops by 40% or more.

The measurement conditions are as follows:
Diameter of large diameter part 23 of first plunger 20: 0.053 mm
Diameter of small diameter part 25 of first plunger 20: 0.033 mm
Thickness of tubular portion 32 of second plunger 30: 0.025 mm
Outer diameter of coil spring 60: 0.106 mm
Inner diameter of coil spring 60: 0.066 mm
Wire diameter of coil spring 60: 0.02 mm.

In recent years, even in the contact probes for high current applications, there has been a demand for a reduction in diameter, and there has been restriction in which the wire diameter of the coil spring cannot be increased. For this reason, there is a problem that melting of the coil spring is caused due to electric conduction of a large current.

JP-A-2010-151732 illustrates an example of an outer spring type probe pin. Since the coil spring is disposed outside the tube shape, it is not suitable for reducing the diameter of the probe pin.

SUMMARY

One or more embodiments relate to a contact probe and an inspection jig capable of allowing a large current to flow, without increasing the outside diameter.

According to one or more embodiments, the contact probe includes a conductive first plunger, a conductive second plunger, and a conductive coil spring disposed outside the first plunger to urge the first plunger and the second plunger in a direction away from each other. The first plunger 20 and the second plunger 30 are fitted to each other so as to be freely slidable with respect to each other. The first plunger includes a large diameter part, and a small diameter part provided on the proximal end side of the large diameter part. The small diameter part is fitted into the second plunger. The coil spring includes a close winding part on a side of the second plunger. In at least the compressed state of the coil spring, adjacent lines of the close winding part are brought into close contact with each other and come into electrical contact to configure a tubular conductor part.

Other aspects and advantages of the invention will be apparent from the following description and the appended claims.

DETAILED DESCRIPTION

Embodiments will be described in detail with reference to the drawings. Note that the same or equivalent elements, members, processes, and the like illustrated in the respective drawings are denoted by the same reference numerals, and redundant description will be omitted as appropriate. In addition, the embodiments do not limit the invention but are examples of the invention, and all the features described in the embodiments and combinations thereof are not necessarily essential to the invention.

<First Embodiment>

Figure 1A:
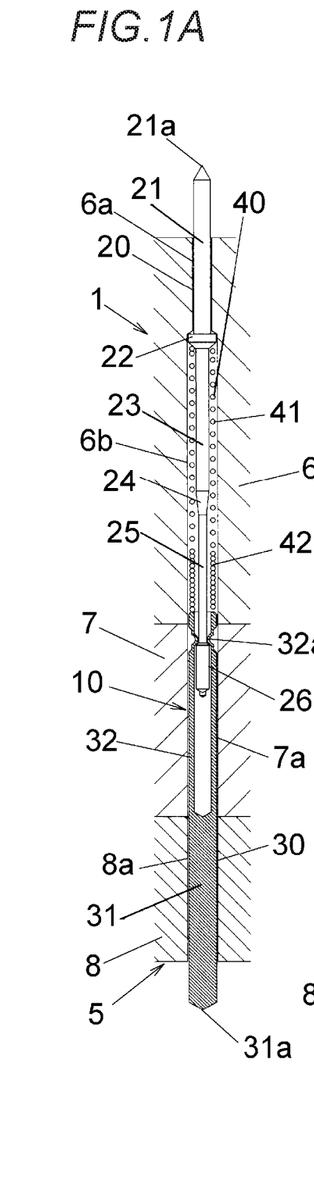
FIG. 1A is a side sectional view illustrating an initial state of the contact probe and the inspection jig according to a first embodiment.
Figure 1B:
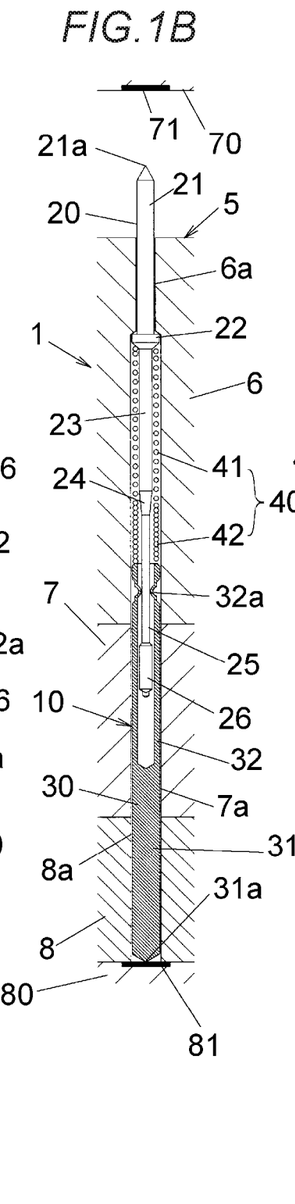
FIG. 1B is a side sectional view illustrating a set state of the contact probe and the inspection jig (a state in which the inspection jig is mounted on the inspection substrate) according to the first embodiment.
Figure 1C:
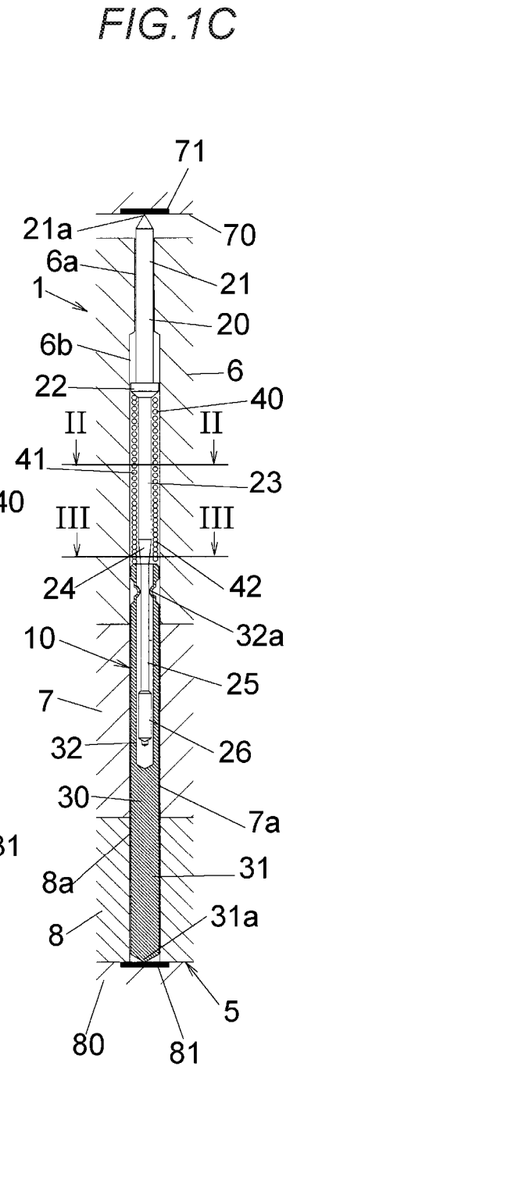
FIG. 1C is a side sectional view illustrating an inspection state of the contact probe and the inspection jig according to the first embodiment.
Figure 2:
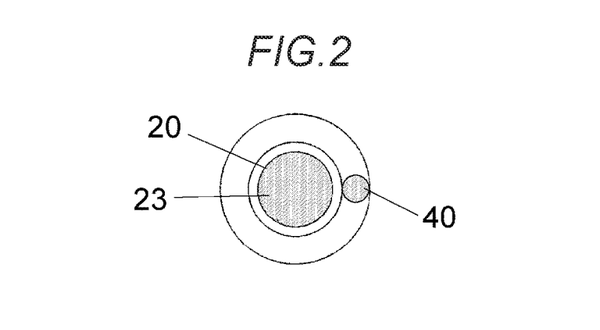
FIG. 2 is an explanatory view illustrating a current path at position of a cross-section taken along line II-II of FIG. 1C.

FIGS. 1A to 1C are side sectional views illustrating a contact probe and an inspection jig according to a first embodiment. FIG. 1A illustrates an initial state, FIG. 1B illustrates a set state (a state in which the inspection jig is mounted on an inspection substrate), and FIG. 1C illustrates an inspection state. FIG. 2 is an explanatory view illustrating a current path at the position of a cross-section taken along the line II-II of FIG. 1C. FIG. 3 is an explanatory view illustrating a current path at a position of a cross-section taken along the line III-III of FIG. 1C. The inspection jig 1 includes a contact probe 10 and a socket 5 made of an insulating resin that holds the contact probe 10 while the contact probe 10 penetrated through the socket 5. Although the number of the contact probe 10 supported by the socket 5 is one in the illustrated example, it may be plural.

The contact probe 10 includes a first plunger 20 and a second plunger 30 which are slidably fitted with each other while the first plunger 20 and the second plunger 30 are contact with each other, and a coil spring 40 which is disposed outside the first plunger 20 to urge the first plunger 20 and the second plunger 30 in a direction of moving away from each other.

The coil spring 40 includes a rough winding part 41 and a close winding part 42. A close winding part 42 is formed on the second plunger 30 side of the rough winding part 41. Adjacent lines of the close winding part 42 are brought into close contact with each other and are brought into electrical contact with each other to configure a tubular conductor part. As the coil spring 40, a general electrically conductive metal wire material such as a piano wire or a stainless steel wire is used. It is desirable to provide a metal plating layer such as Au on the coil spring 40 in order to ensure electrical contact between adjacent lines of the close winding part 42. A metal plating layer of Au or the like may be provided after processing of the close winding part 42 of the coil spring 40 or the wire provided with the metal plating layer such as Au or the like may be processed as the coil spring 40 including the close winding part 42.

The coil spring 40 interposed between a flange portion 22 of the first plunger 20 and a proximal-end-side end face of the second plunger 30 (a proximal-end-side end surface of the tubular portion 32) on the outside of the first plunger 20 and the inner side of the large diameter part 6b of the first insulating support 6. When a compressive force is applied to the coil spring 40, the coil spring 40 is deformed and the inner periphery of the close winding part 42 configuring the tubular conductor part comes into electrical contact with the outer periphery of the large diameter part 23 of the first plunger 20. In order to ensure the electrical contact (by increasing deformation amount of the coil spring), an end face of the coil spring 40 on a side abutting on the second plunger 30 is inclined.

Since the configuration other than the coil spring 40 is similar to the related art of FIGS. 8A, 8B, and 8C, description thereof is omitted.

According to the first embodiment, in the initial state of FIG. 1A, the first plunger 20 and the second plunger 30 protrude from the socket 5. When the socket 5 is placed on the inspection substrate 80 as in the set state of FIG. 1B, the contact portion 31a of the distal end of the second plunger 30 comes into contact with the electrode pad 81 of the inspection substrate 80. In the set state, the tapered portion 24 of the first plunger 20 is in a state of being entered the close winding part 42 of the coil spring 40, and the insertion of the first plunger 20 into the close winding part 42 for shifting to the inspection state as the next step is smoothly performed. When the electrode pad 71 of the inspection object 70 is pressed against the contact portion 21a at the distal end of the first plunger 20 as in the inspection state of FIG. 1C from the set state, the coil spring 40 is compressed. Therefore, the contact probe 10 comes into contact with the electrode pad 71 of the inspection object 70 and the electrode pad 81 of the inspection substrate 80 with a sufficient contact pressure. As a result, the contact probe 10 electrically connects the electrode pad 71 and the electrode pad 81, and allows an electric current to flow between the electrode pad 71 and the electrode pad 81. In the inspection state of FIG. 1C, in the coil spring 40, the side of the close winding part 42 constituting the tubular conductor part close to the rough winding part 41 comes into electrical contact with the large diameter part 23 of the first plunger 20.

In the contact probe 10B of the related art, there is a portion in which the cross-sectional area of the current path becomes small in the inspection state, and the energizing current is restricted. On the other hand, in the case of the contact probe 10 of the first embodiment, the change in the cross-sectional area of the current path is small. That is, in FIG. 2, which is an explanatory view illustrating the current path at the position of the cross-section taken along the line II-II of FIG. 1C, the sum of the cross-sectional area of the large diameter part 23 of the first plunger 20 and the wire material cross-sectional area of the coil spring 40 can contribute the electric conduction, and can withstand a sufficiently large current. Further, in FIG. 3, which is an explanatory view illustrating a current path at a position of a cross-section taken along the line III-III in FIG. 1C, the close winding part 42 of the coil spring 40 (adjacent lines are in close contact with each other and in electrical contact with each other) is a tubular conductor part, and configures a current path having a large sectional area so as to compensate for the small sectional area of the tapered portion 24 close to the small diameter part 25 of the first plunger 20.

Therefore, the coil spring 40 does not melt down in the required current range, and the maximum current value that can be applied to the contact probe 10 can be made to be larger than that of the contact probe 10B of the related art.

A solid line K of FIG. 4 illustrates a relationship between the energizing current [A] of the contact probe 10 of the first embodiment and the reduction rate [%] of the spring force. Even at about 1.3 A, the reduction in spring force is slight (less than 20%), which is a performance that can sufficiently cope with high current applications.

The measurement conditions are as follows (same as the related art except for the point of the close winding part 42):

Diameter of large diameter part 23 of first plunger 20: 0.053 mm

Diameter of small diameter part 25 of first plunger 20: 0.033 mm

Thickness of tubular portion 32 of second plunger 30: 0.025 mm

Outer diameter of coil spring 40: 0.106 mm

Inner diameter of coil spring 40: 0.066 mm

Wire diameter of coil spring 40: 0.02 mm.

According to the first embodiment, in the contact probe 10 and the inspection jig 1 including the contact probe 10, the coil spring 40 includes a close winding part 42 in which lines on the side coming into contact with the second plunger 30 are brought into close contact with and come into electrical contact with each other (that is, a cylindrical conductor part). The close winding part 42 comes into direct contact with the large diameter part 23 serving as the shaft portion of the first plunger 20. For this reason, it is possible to enlarge the cross-sectional area of the current path and allow a larger current to flow than the product of the related art.

The end face of the coil spring 40 on the side coming into contact with the second plunger 30 is inclined. Therefore, when the coil spring 40 is deflected by the compressive force, the inner periphery of the close winding part 42 more reliably comes into electrical contact with the outer periphery of the large diameter part 23 of the first plunger 20.

As a material of the coil spring 40, a general conductor metal wire material such as a piano wire or a stainless steel wire is used. A metal plating layer such as Au is provided on the coil spring 40. Therefore, it is possible to further secure electrical contact between adjacent lines of the close winding part 42.

<Second Embodiment>

Figures 5A, 5B:
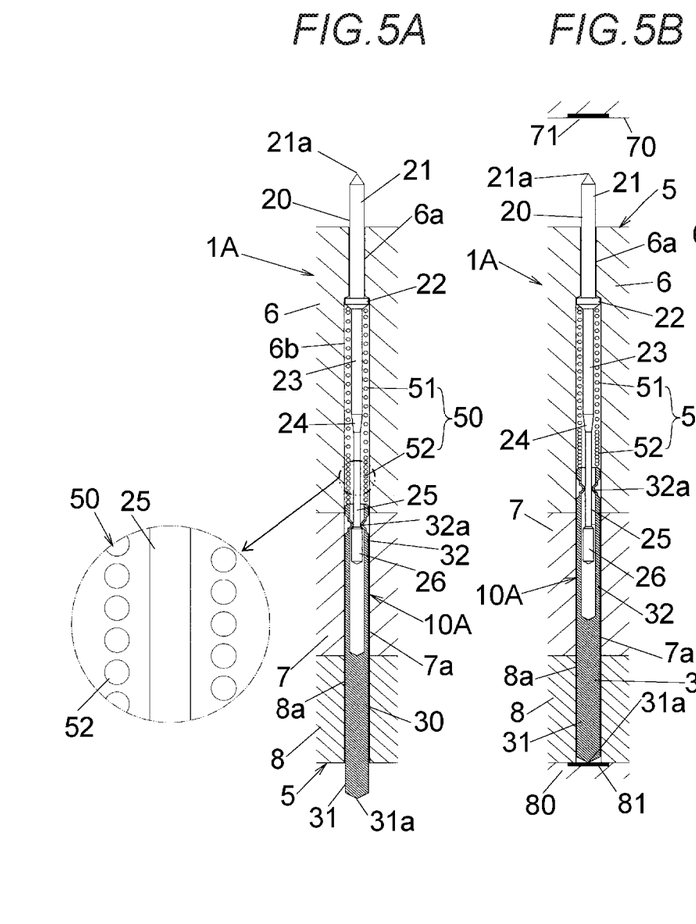
FIG. 5A is a side cross-sectional view illustrating the initial state of the contact probe and the inspection jig according to a second embodiment.
FIG. 5B is a side cross-sectional view illustrating a set state of the contact probe and the inspection jig (a state in which the inspection jig is mounted on the inspection substrate) according to the second embodiment.
Figure 5C:
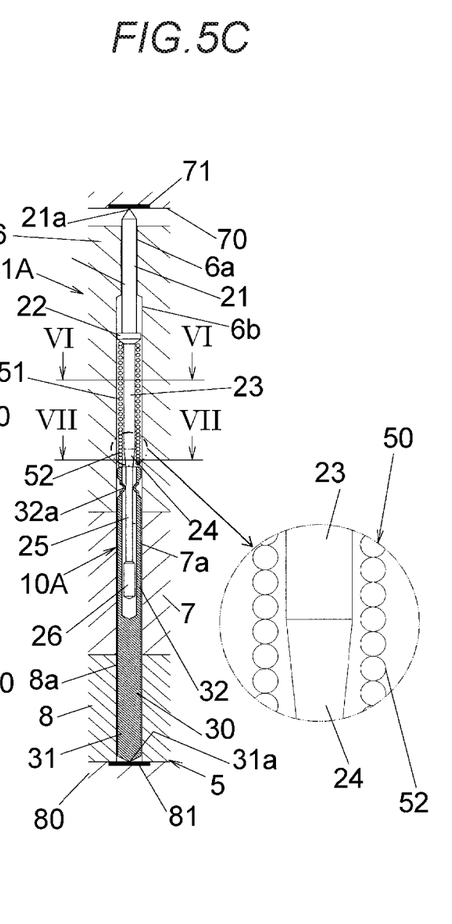
FIG. 5C is a side cross-sectional view illustrating the inspection state of the contact probe and the inspection jig according to the second embodiment.
Figure 6:
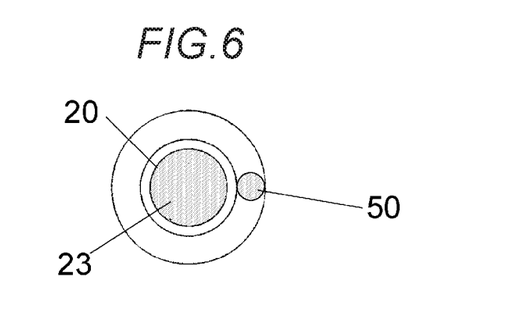
FIG. 6 is an explanatory view illustrating a current path at a position of a cross-section taken along the line VI-VI of FIG. 5C.
Figure 7:
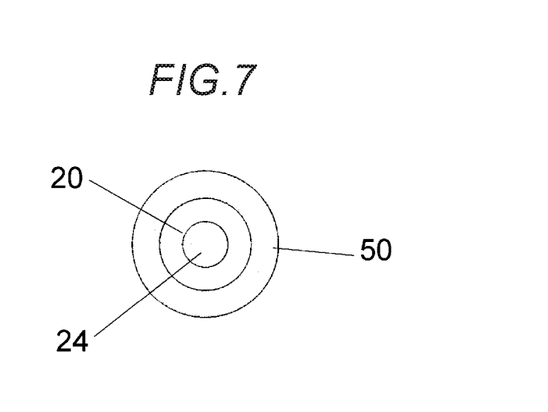
FIG. 7 is an explanatory view illustrating a current path at a position of a cross-section taken along the line VII-VII of FIG. 5C.

FIGS. 5A to 5C are side sectional views of the contact probe and the inspection jig according to the second embodiment. FIG. 5A illustrates the initial state, FIG. 5B illustrates a set state (a state in which the inspection jig is mounted on the inspection substrate), and FIG. 5C illustrates the inspection state, respectively. FIG. 6 is an explanatory view illustrating a current path at a position of a cross-section taken along the line VI-VI of FIG. 5C. FIG. 7 is an explanatory view illustrating a current path at the position taken along the line VII-VII of FIG. 5C The inspection jig 1A includes a contact probe 10A, and a socket 5 made of an insulating resin that holds the contact probe 10A while the contact probe 10A penetrates through the socket 5. Although the number of the contact probes 10A supported by the socket 5 is one in the illustrated example, it may be plural.

The contact probe 10A includes a first plunger 20, and a second plunger 30 which are slidably fitted to each other in contact with each other, and a coil spring 50 which is disposed outside the first plunger 20 to urge the first and second plungers 20 and 30 in a direction away from each other. Since the contact probe 10A of the second embodiment is different from the contact probe 10 of the first embodiment in the structure of the coil spring, the coil spring 50 of the second embodiment will be described.

According to the second embodiment, the coil spring 50 includes a rough winding part 51 and a close winding part 52. The close winding part 52 is formed on the second plunger 30 side of the rough winding part 51. In the close winding part 52, in the initial state of FIG. 5A, a minute gap exists between adjacent lines of the close winding part 52 (see the enlarged portion). In the process of reaching the inspection state of FIG. 5C, as the coil spring 50 is compressed, the adjacent lines of the close winding part 52 are brought into close contact with each other and come into electrical contact to configure the tubular conductor part. Therefore, the coil spring 50 functions in the same manner as the coil spring 40 of the first embodiment in an inspection state in which electricity is actually applied. As a material of the coil spring 50, a general electrically conductive metal wire material such as a piano wire or a stainless steel wire is used. It is desirable to provide a metal plating layer such as Au on the coil spring 50 in order to ensure electric contact between adjacent fines of the close winding part 52.

In the case of the coil spring 50 used in the second embodiment, the adjacent lines of the close winding part 52 are brought into close contact with each other in a compressed inspection state to configure the tubular conductor part. Therefore, it is easy to manufacture the coil spring 50. Other configurations and operational effects are similar to those in the first embodiment.

Although the present invention has been described with reference to the embodiments, it is understood by those skilled in the art that various modifications can be made to the elements and the respective processing processes of the embodiments. Modified examples will be described below.

Depending on the inspection objects, the distal end shape of the first and second plungers of the contact probe can be changed.

According to embodiments, the contact probe 10, 10A includes a conductive first plunger 20, a conductive second plunger 30, and a conductive coil spring 40, 50 which is disposed outside the first plunger 20 to urge the first plunger 20 and the second plunger 30 in a direction away from each other. The first plunger 20 and the second plunger 30 are fitted to each other so as to be freely slidable with respect to each other. The first plunger 20 includes a large diameter part 23, and a small diameter part 25 provided on the proximal-end-side of the large diameter part 23. The small diameter part 25 is fitted into the second plunger 30. The coil spring 40, 50 include a close winding part 42, 52 on the side of the second plunger 30. In at least the compressed state of the coil spring 40, 50, the adjacent lines of the close winding part 42, 52 are brought into close contact with each other and come into electrical contact with each other to configure a tubular conductor part.

The coil spring 40, 50 may include a metal plating layer for bringing the adjacent lines of the close winding part into electrical contact with each other. The close winding part 42, 52 may configure the tubular conductor part.

In the compressed state of the coil spring 40, 50, the tubular conductor part may be in electrical contact with the large diameter part 23 of the first plunger 20.

The end faces of the coil spring 40, 50 on the side abutting on the second plunger 30 may be inclined.

According to embodiments, the inspection jig 1, 1A includes the above-described contact probe 10, 10A, and a socket 5 made of an insulating resin which holds the contact probes while the contact probe penetrates through the socket.

Arbitrary combinations of the elements of the embodiments would be effective as aspects of the invention. Even if the invention is expressed as methods, systems, and the like, those would be effective as aspects of the invention.

According to embodiments, by providing the close winding part in the coil spring, adjacent lines of the close winding part are brought into close contact with each other and come into electrical contact with each other at least in the inspection state to configure the tubular conductor part, and by utilizing the tubular conductor part as a current path, it is possible to allow a larger current to flow than the product of the related art without increasing the outer diameter of the contact probe.

REFERENCE NUMERALS 1, 1A, 1B Inspection jig
5 Socket
10, 10A, 10B Contact probe
20 First plunger
23 Large diameter part
25 Small diameter part
30 Second plunger
40, 50, 60 Coil spring
41, 51 Rough winding part
42, 52 Close winding part
70 Inspection object
71, 81 Electrode pad
80 Inspection substrate

What is claimed is:

1. A contact probe comprising: a first plunger which is electrically conductive; a second plunger which is electrically conductive; and a coil spring which is electrically conductive, is disposed outside the first plunger, and urges the first plunger and the second plunger in a direction away from each other, wherein the first plunger and the second plunger are fitted to each other so as to be slidable with respect to each other, wherein the first plunger includes a large diameter part, a small diameter part provided on a proximal end side of the large diameter part, and a tapered portion formed between the large diameter part and the small diameter part, wherein the tapered portion enters into the close winding parts of the coil spring in the compressed state, wherein the small diameter part is fitted into the second plunger, wherein the coil spring includes a close winding part on a side of the second plunger, wherein adjacent lines of the close winding parts are brought into close contact with each other and come into electrical contact with each other at least in a compressed state of the coil spring to configure a tubular conductor part, wherein in the compressed state, the tubular conductor part configures a current path having a large sectional area to compensate a current path having a small section area at the tapered portion, and wherein the close winding parts electrically and physically contact with the large diameter part of the first plunger in the compressed state.

2. The contact probe according to claim 1, wherein the coil spring includes a metal plating layer through which the adjacent lines of the close winding part are brought into electrical contact with each other, and
   wherein the close winding part configures the tubular conductor part.

3. The contact probe according to claim 1, wherein, in the compressed state of the coil spring, the tubular conductor part electrically contacts with the large diameter part of the first plunger.

4. The contact probe according to claim 1, wherein an end face of the coil spring on a side of abutting on the second plunger is inclined.

5. An inspection jig comprising:
   the contact probe according to claim 1; and
   an electrically insulating resin socket through which the contact probe penetrates and which holds the contact probe.

* * * * *